US008625378B2

(12) United States Patent  
Fukuda

(10) Patent No.: US 8,625,378 B2  
(45) Date of Patent: Jan. 7, 2014

(54) NONVOLATILE SEMICONDUCTOR MEMORY

(75) Inventor: Koichi Fukuda, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 66 days.

(21) Appl. No.: 13/459,724

(22) Filed: Apr. 30, 2012

(65) Prior Publication Data

US 2012/0281470 A1 Nov. 8, 2012

(30) Foreign Application Priority Data

May 6, 2011 (JP) ................................. 2011-103659

(51) Int. Cl.
G11C 7/00 (2006.01)
(52) U.S. Cl.
USPC .................. 365/226; 365/185.17; 365/185.18; 365/189.09
(58) Field of Classification Search
USPC .................... 365/185.17, 185.18, 189.09, 226
See application file for complete search history.

(56) References Cited

U.S. PATENT DOCUMENTS

| 7,170,787 | B2 | 1/2007 | Sakurai et al. | |
| 2002/0021602 | A1* | 2/2002 | Morishita | 365/201 |
| 2005/0057957 | A1* | 3/2005 | Masui | 365/145 |
| 2008/0001656 | A1 | 1/2008 | Takeuchi | |
| 2009/0195292 | A1* | 8/2009 | Kanno et al. | 327/333 |

FOREIGN PATENT DOCUMENTS

JP 2008-11446 1/2008

* cited by examiner

Primary Examiner — Hoai V Ho  
(74) Attorney, Agent, or Firm — Oblon, Spivak, McClelland, Maier & Neustadt, L.L.P.

(57) ABSTRACT

A nonvolatile semiconductor memory includes a first power supply voltage pad to which a first power supply voltage required for a writing, reading or erasing operation of the memory cells is applied. The nonvolatile semiconductor memory includes a second power supply voltage pad to which a second power supply voltage that is lower than the first power supply voltage and to be supplied to the I/O circuit is applied. The nonvolatile semiconductor memory includes a first voltage down-converting circuit that converts the first power supply voltage down to a first down-converted voltage that is higher than the second power supply voltage. The nonvolatile semiconductor memory includes a second voltage down-converting circuit that converts the second power supply voltage down to a second down-converted voltage that is lower than the first down-converted voltage.

20 Claims, 12 Drawing Sheets

NONVOLATILE SEMICONDUCTOR MEMORY

CROSS-REFERENCE TO RELATED APPLICATION

This application is based upon and claims the benefit of priority from the prior Japanese Patent Application No. 2011-103659, filed on May 6, 2011, the entire contents of which are incorporated herein by reference.

BACKGROUND

1. Field

Embodiments described herein relate generally to a nonvolatile semiconductor memory.

2. Background Art

To improve the performance of SSDs, Smart Phones, Tablet PCs or the like, there is a strong demand for improving the performance of the systems incorporating NAND flash memories.

Recent NAND-type flash memories incorporate a fast toggle DDR interface to improve the read-out throughput and can transfer data at high rates of 133 Mbps to 400 Mbps. The power supply voltage "VccQ" for I/O is typically 1.8 V in order to reduce the power and current consumptions in data transfer.

As the size of memory cells is scaled down, the interference between adjacent cells, the program noise or other noise, the RC time constant of the bit lines and the word lines and the like are deteriorating. In the state of art, it is barely possible to maintain the writing throughput of the previous-generation NAND-type flash memory.

To improve the writing throughput, the size of the page written at one time has been increased from 2 KB to 4 KB, to 8 KB, to 16 KB, 32 KB and then to 64 KB. However, further increasing the page size is impracticable because the chip size and the current consumption substantially increase.

To improve the writing performance of the memory system, there is a solution of activating a plurality of chips of NAND-type flash memories at the same time. However, since a plurality of chips operate at the same time, the power and current consumptions increase accordingly. The number of chips that operate at the same time is limited so that the system's capability of supplying power or current is not exceeded, or the temperature of the chips, which consume power and generate heat, does not exceed the guaranteed temperature. To improve the performance, the number of chips that operate at the same time has to be further increased, and to this end, there is a strong demand for reducing the power consumption and current consumption of the NAND-type flash memories.

One solution to reduce the power consumption is to reduce the power supply voltage "Vcc" to 1.8 V. In fact, products using the power supply voltage "Vcc" of 1.8 V have already been commercialized in applications where low power consumption is particularly demanded.

The NAND-type flash memory requires approximately 5 to 25 V for writing and approximately 5 to 10 V for reading, and these voltages have to be generated by a charge pump circuit in the chip.

Unfortunately, charge pump circuits that generate the high voltages from the power supply voltage "Vcc" of 1.8 V has a larger area, requires a larger chip size and consumes a higher current than charge pump circuits that generate the high voltages from the power supply voltage "Vcc" of 3.3 V.

DETAILED DESCRIPTION

A nonvolatile semiconductor memory according to an embodiment includes a memory cell array including a plurality of memory cells. The nonvolatile semiconductor memory includes an input/output pad. The nonvolatile semiconductor memory includes an I/O circuit that outputs data read from the memory cells to the outside through the input/output pad and to which writing data and a command are input from the outside through the input/output pad. The nonvolatile semiconductor memory includes a first power supply voltage pad to which a first power supply voltage required for a writing, reading or erasing operation of the memory cells is applied. The nonvolatile semiconductor memory includes a second power supply voltage pad to which a second power supply voltage that is lower than the first power supply voltage and to be supplied to the I/O circuit is applied. The nonvolatile semiconductor memory includes a first voltage down-converting circuit that converts the first power supply voltage down to a first down-converted voltage that is higher than the second power supply voltage. The nonvolatile semiconductor memory includes a second voltage down-converting circuit that converts the second power supply voltage down to a second down-converted voltage that is lower than the first down-converted voltage. The nonvolatile semiconductor memory includes a first circuit group that requires a voltage equal to or lower than the first power supply voltage and equal to or higher than the second power supply voltage and to which the first down-converted voltage is supplied. The nonvolatile semiconductor memory includes a second circuit group to which the second down-converted voltage is supplied.

In the following, embodiments will be described with reference to the drawings. In the following description of the embodiments, a NAND-type flash memory will be taken as an example of a nonvolatile semiconductor memory. However, the same description holds true for other types of nonvolatile semiconductor memories, such as a NOR-type flash memory.

First Embodiment

Figure 1:
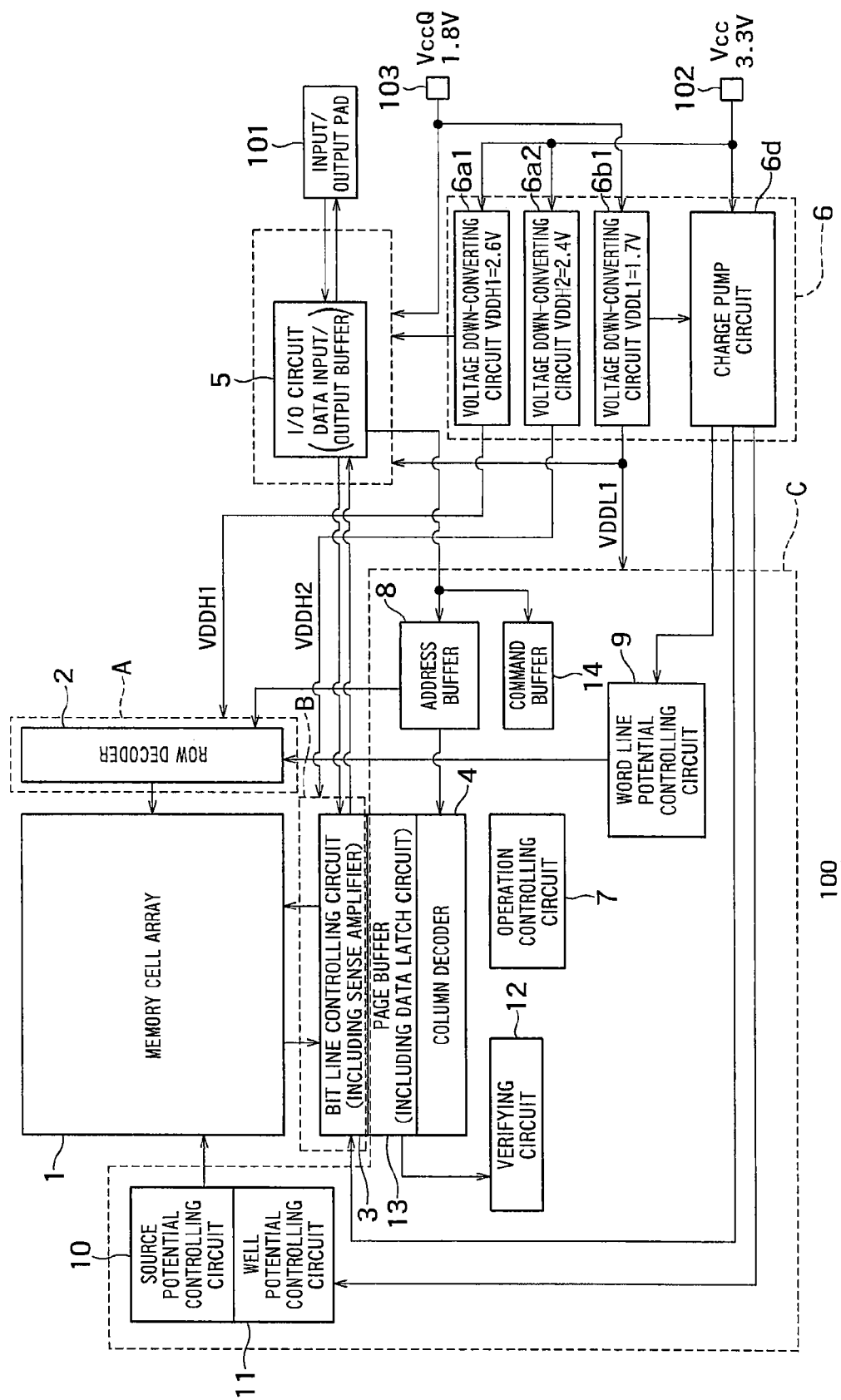
FIG. 1 is a block diagram showing a configuration of a NAND-type flash memory 100 according to the first embodiment.

FIG. 1 is a block diagram showing a configuration of a NAND-type flash memory 100 according to a first embodiment.

As shown in FIG. 1, a NAND-type flash memory 100, which is a nonvolatile semiconductor memory, includes a memory cell array 1, a row decoder 2, a bit line controlling circuit 3, a column decoder 4, an I/O circuit (data input/output buffer) 5, an inner voltage generating circuit 6, an operation controlling circuit 7, an address buffer 8, a word line potential controlling circuit 9, a well potential controlling circuit 11, a source potential controlling circuit 10, a verifying circuit 12, a page buffer 13, a command buffer 14, an input/output pad 101, a first power supply voltage pad 102, and a second power supply voltage pad 103.

The memory cell array 1 includes a plurality of NAND strings arranged in a matrix and each connected to a word line WL in a row direction and a bit line BL in a column direction. The NAND string is composed of a plurality of memory cells connected in series with each other and two selecting gates (an SGS transistor and an SGD transistor) connected to both ends of the series connected memory cells. The selecting gate on the source side or SGS is connected to a source line SRC, and the selecting gate on the drain side or SGD is connected to a bit line BL.

The row decoder 2 includes a word line driving circuit (not shown), selects a word line from among the word lines in the memory cell array 1, and drives the selected word line.

The bit line controlling circuit 3 has a circuit (not shown) that controls the potential of the bit line BL and a sense amplifier (not shown) that senses the voltage or current at the bit line in a verification reading operation and a reading operation. The page buffer 13 has a data latch circuit (not shown) that stores page data, such as a reading result and writing data.

The bit line controlling circuit 3 controls the potential of the bit line BL, thereby performing writing control, the verification reading operation, or the reading operation.

The NAND-type flash memory is typically written or read in units of a page of 512 bytes to 16 Kbytes. That is, the bit line controlling circuit 3 can control the bit lines BL corresponding to one page of 512 bytes to 16 Kbytes at the same time.

The column decoder 4 performs selection in the bit line controlling circuit 3 and the page buffer 13 connected to the bit lines in the memory cell array 1.

The I/O circuit (data input/output buffer) 5 is configured to outputs the read data read from the memory cells to the outside through the input/output pad 101, and to receive writing data to be written to the memory cells and a command from the outside through the input/output pad 101.

In data reading, the data read by the bit line controlling circuit 3 is transferred to the I/O circuit (data input/output buffer) 5.

The inner voltage generating circuit 6 converts the first and second power supply voltages down or up to generate voltages to be supplied to the bit line controlling circuit 3, the column decoder 4, the I/O circuit (data input/output buffer) 5, the operation controlling circuit 7, the address buffer 8, the word line potential controlling circuit 9, the well potential controlling circuit 11, the source potential controlling circuit 10, the verifying circuit 12, the page buffer 13, and the command buffer 14. The inner voltage generating circuit 6 has first and second voltage down-converting circuits 6a1, 6a2 and 6b1 and a charge pump circuit 6d.

The word line potential controlling circuit 9 controls the word line voltage to be supplied to the word line (controlling gate) in the memory cell array 1 and supplies the voltage to the row decoder 2.

The well potential controlling circuit 11 controls the well voltage to be supplied to the well of the memory cell array 1.

The source potential controlling circuit 10 controls the source voltage to be supplied to the source of the memory cell array 1.

When external control signals, such as a chip enable signal CE, a write enable signal WE, a read enable signal RE, an address latch enable signal ALE and a command latch enable signal CLE, and a command code are input to the input/output pads 101 from the outside of the chip, the command code is supplied to the command buffer 14 through the I/O circuit (data input/output buffer) 5. The command buffer 14 decodes the command code and supplies the decoded command code to the operation controlling circuit 7 as a command signal.

Based on the command signal supplied from the command buffer 14, the operation controlling circuit 7 controls the row decoder 2, the bit line controlling circuit 3, the column decoder 4, the I/O circuit (data input/output buffer) 5, the inner voltage generating circuit 6, the word line potential controlling circuit 9, the well potential controlling circuit 11, the source potential controlling circuit 10, the verifying circuit 12 and the page buffer 13, thereby performing a sequence control for data writing, erasing or reading.

In response to the operation controlling circuit 7 outputting signals to control the reading, writing, erasing or other operation, the row decoder 2, the bit line controlling circuit 3, the inner voltage generating circuit 6, the word line potential controlling circuit 9, the well potential controlling circuit 11 and the source potential controlling circuit 10 generate voltages for the operation.

In addition, in response to the operation controlling circuit 7 outputting signals to control the verification operation, the verifying circuit 12 performs the verification operation.

The address of the memory cell received at the I/O circuit 5 is transferred to the row decoder 2 and the column decoder 4 via the address buffer 8.

Based on the result of sensing by the bit line controlling circuit 3 in verification reading, the verifying circuit 12 determines whether or not the threshold voltage has reached a verification level for the written state or erased state in all the memory cells or all the memory cells except for an allowable number of memory cells in a page to be written or in a block to be erased. Then, the verifying circuit 12 outputs the verification result to the operation controlling circuit 7.

Then, based on the verification result, the operation controlling circuit 7 controls the row decoder 2, the bit line controlling circuit 3, the inner voltage generating circuit 6, the word line potential controlling circuit 9, the well potential controlling circuit 11, the source potential controlling circuit 10 and the page buffer 13 to continue the writing operation or erasing operation until the threshold voltage reaches (passes) the verification level in the memory cells in the page to be written or in the block to be erased.

To the first power supply voltage pad 102, a first power supply voltage "Vcc" (3.3 V, for example) required for the writing, reading or erasing operation of the memory cell is applied.

To the second power supply voltage pad 103, a second power supply voltage "VccQ" (1.8 V, for example) that is lower than the first power supply voltage "Vcc" and is to be supplied to the I/O circuit 5 is applied.

As shown in FIG. 1, the inner voltage generating circuit 6 has the first voltage down-converting circuits 6a1 and 6a2, the second voltage down-converting circuit 6b1, and the charge pump circuit 6d.

The charge pump circuit 6d outputs a plurality of levels of voltages raised from the first power supply voltage "Vcc" supplied from the first power supply voltage pad 102.

The first voltage down-converting circuits 6a1 and 6a2 convert the first power supply voltage "Vcc" supplied from the first power supply voltage pad 102 down to the first down-converted voltages "VDDH1" (2.6 V, for example) and "VDDH2" (2.4 V, for example) higher than the second power supply voltage "VccQ".

The second voltage down-converting circuit 6b1 lowers the second power supply voltage "VccQ" supplied from the second power supply voltage pad 103 and outputs the second down-converted voltage "VDDL1" (1.7 V, for example) lower than the first down-converted voltage "VDDH1".

In FIG. 1, a first circuit group indicated by dotted line boxes A and B to which the first down-converted voltages "VDDH1" and "VDDH2" are supplied, respectively, is composed of the circuits that require voltages (that is, the first down-converted voltages "VDDH1" and "VDDH2") equal to or lower than the first power supply voltage "Vcc" and equal to or higher than the second power supply voltage "VccQ" to operate. The first circuit group includes the row decoder 2 and the bit line controlling circuit 3, for example.

A second circuit group indicated by a dotted line box C is a circuit to which the second down-converted voltage "VDDL1" is supplied. The second circuit group includes the column decoder 4, the I/O circuit (data input/output buffer) 5, the operation controlling circuit 7, the address buffer 8, the verifying circuit 12, the page buffer 13 and the command buffer 14. "VDDL1" is also supplied to the charge pump 6.

The second power supply voltage "VccQ" from the second power supply voltage pad 103 is supplied to the I/O circuit 5, and if necessary, the first down-converted voltage "VDDH1" from the first voltage down-converting circuit 6a1 and the second down-converted voltage "VDDL1" from the second voltage down-converting circuit 6b1 are also supplied to the I/O circuit 5.

Figure 2:
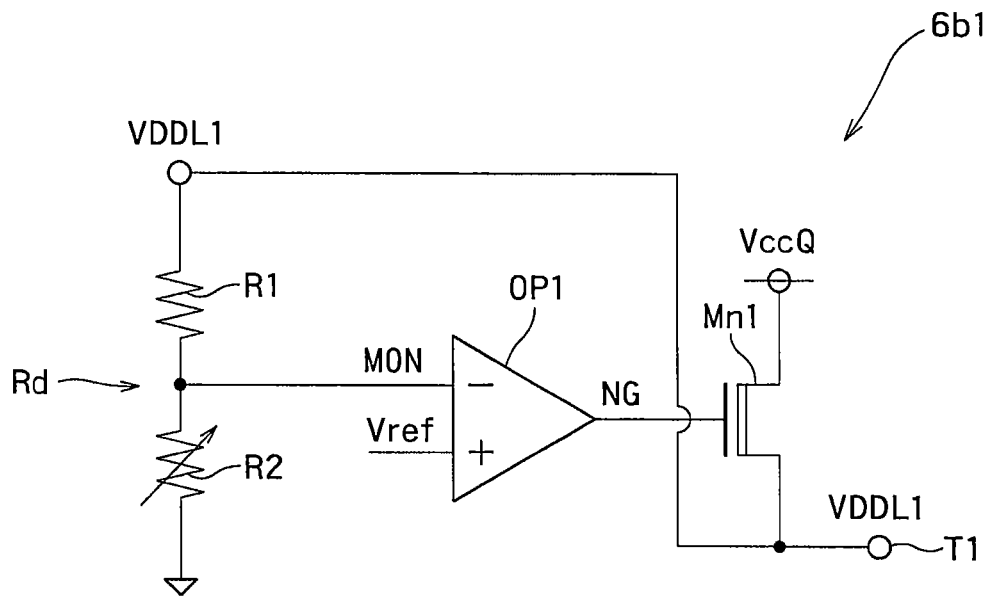
FIG. 2 is a diagram showing an example of a configuration of the voltage down-converting circuit 6$b$1 in the NAND-type flash memory 100 shown in FIG. 1.

FIG. 2 is a diagram showing an example of a configuration of the voltage down-converting circuit 6b1 in the NAND-type flash memory 100 shown in FIG. 1. The voltage down-converting circuits 6a1 and 6a2 shown in FIG. 1 have the same configuration as the circuit shown in FIG. 2.

As shown in FIG. 2, the second voltage down-converting circuit 6b1 has an MOS transistor (nMOS transistor) Mn1, a voltage dividing circuit Rd, and an operational amplifier OP1.

The MOS transistor Mn1 is connected between the second power supply voltage pad 103 through a power supply wire electrically connected to the second power supply voltage pad 103 and a output terminal T1 at which the second down-converted voltage "VDDL1" is output.

The voltage dividing circuit Rd divides the second down-converted voltage "VDDL1" with a voltage dividing ratio (R2/(R1+R2)) determined by voltage dividing resistances R1 and R2 and outputs the resulting divided voltage "MON". The voltage dividing ratio can be adjusted by changing (trimming) the resistance of the voltage dividing resistor R2, which is a variable resistor.

The operational amplifier OP1 compares the divided voltage "MON" and a reference voltage "Vref" and outputs a gate signal NG that controls the MOS transistor Mn1 according to the comparison result.

If the divided voltage "MON" is higher than the reference voltage "Vref", the operational amplifier OP1 outputs the gate signal NG that turns off the MOS transistor Mn1. On the other hand, if the divided voltage "MON" is lower than the reference voltage "Vref", the operational amplifier OP1 outputs the gate signal NG that turns on the MOS transistor Mn1.

In this way, the second voltage down-converting circuit 6b1 controls the second down-converted voltage "VDDL1" to be a desired voltage, which is determined by adjusting the voltage dividing ratio.

Figure 3:
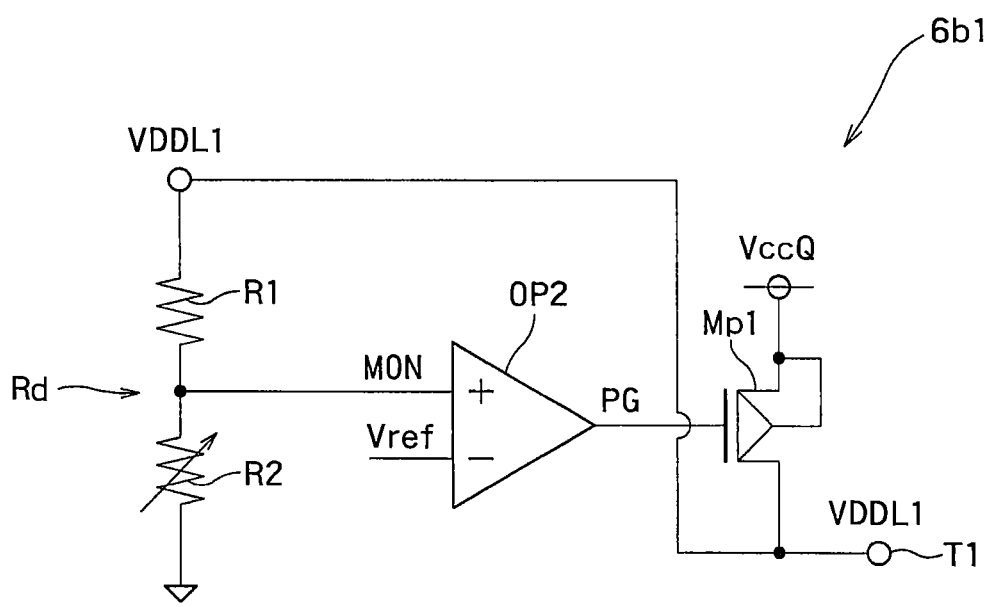
FIG. 3 is a diagram showing another example of the configuration of the voltage down-converting circuit 6$b$1 in the NAND-type flash memory 100 shown in FIG. 1.

FIG. 3 is a diagram showing another example of the configuration of the voltage down-converting circuit 6b1 in the NAND-type flash memory 100 shown in. FIG. 1. The voltage down-converting circuits 6a1 and 6a2 shown in FIG. 1 have the same configuration as the circuit shown in FIG. 3.

As shown in FIG. 3, the second voltage down-converting circuit 6b1 has an MOS transistor (pMOS transistor) Mp1, a voltage dividing circuit Rd, and an operational amplifier OP2.

The MOS transistor Mp1 is connected between the second power supply voltage pad 103 through a power supply wire electrically connected to the second power supply voltage pad 103 and a output terminal T1 at which the second down-converted voltage "VDDL1" is output.

The voltage dividing circuit Rd divides the second down-converted voltage "VDDL1" with a voltage dividing ratio determined by voltage dividing resistances R1 and R2 and outputs the resulting divided voltage "MON". The voltage dividing ratio can be adjusted by changing (trimming) the resistance of the voltage dividing resistor R2, which is a variable resistor.

The operational amplifier OP2 compares the divided voltage "MON" and a reference voltage "Vref" and outputs a gate signal PG that controls the operation of the MOS transistor Mp1 according to the comparison result.

If the divided voltage "MON" is higher than the reference voltage "Vref", the operational amplifier OP2 outputs the gate signal PG that turns off the MOS transistor Mp1. On the other hand, if the divided voltage "MON" is lower than the reference voltage "Vref", the operational amplifier OP2 outputs the gate signal PG that turns on the MOS transistor Mp1.

In this way, as in the example shown in FIG. 2, the second voltage down-converting circuit 6b1 controls the second down-converted voltage "VDDL1" to be a desired voltage, which is determined by adjusting the voltage dividing ratio.

As described above, the first power supply voltage "Vcc" (3.3 V) is supplied to the charge pump circuit 6d, the first down-converted voltages "VDDH1" and "VDDH2" generated by down-converting the first power supply voltage "Vcc" are supplied to the first circuit group (the bit line controlling circuit 3, the row decoder 2 and the like) that requires a voltage higher than the second power supply voltage "VccQ" (1.8 V), and the second down-converted voltage "VDDL1" generated by down-converting the second power supply voltage "VccQ" is supplied to the remaining second circuit group.

According to the prior art, the down-converted voltage "VDDL1" generated by down-converting the first power supply voltage "Vcc" is supplied to the second circuit group. On the other hand, according to this embodiment, the down-converted voltage "VDDL1" generated by down-converting the second power supply voltage "VccQ" is supplied to the second circuit group. By the way, the power consumption is the product of the power supply voltage and the current consumption. According to this embodiment, the power supply voltage from which the down-converted voltage "VDDL1" is generated is the second power supply voltage "VccQ" (1.8 V, for example), which is lower than the first power supply voltage "Vcc" (3.3 V, for example) according to the prior art, and therefore, the power consumption decreases accordingly. Thus, according to this embodiment, since the power consumption of the circuit that operates with the second down-converted voltage "VDDL1" substantially decreases as described above, the power consumption of the entire chip can be substantially reduced compared with the prior art.

As described above, the NAND-type flash memory 100 according to the first embodiment can reduce power consumption.

Second Embodiment

In the first embodiment, a case has been described where two down-converted voltages "VDDH1" and "VDDH2" are generated from the first power supply voltage "Vcc", and one down-converted voltage "VDDL1" is generated from the second power supply voltage "VccQ".

In a second embodiment, a case will be described where one down-converted voltage "VDDH1" is generated from the first power supply voltage "Vcc", and two down-converted voltages "VDDL1" and "VDDL2" are generated from the second power supply voltage "VccQ".

Figure 4:
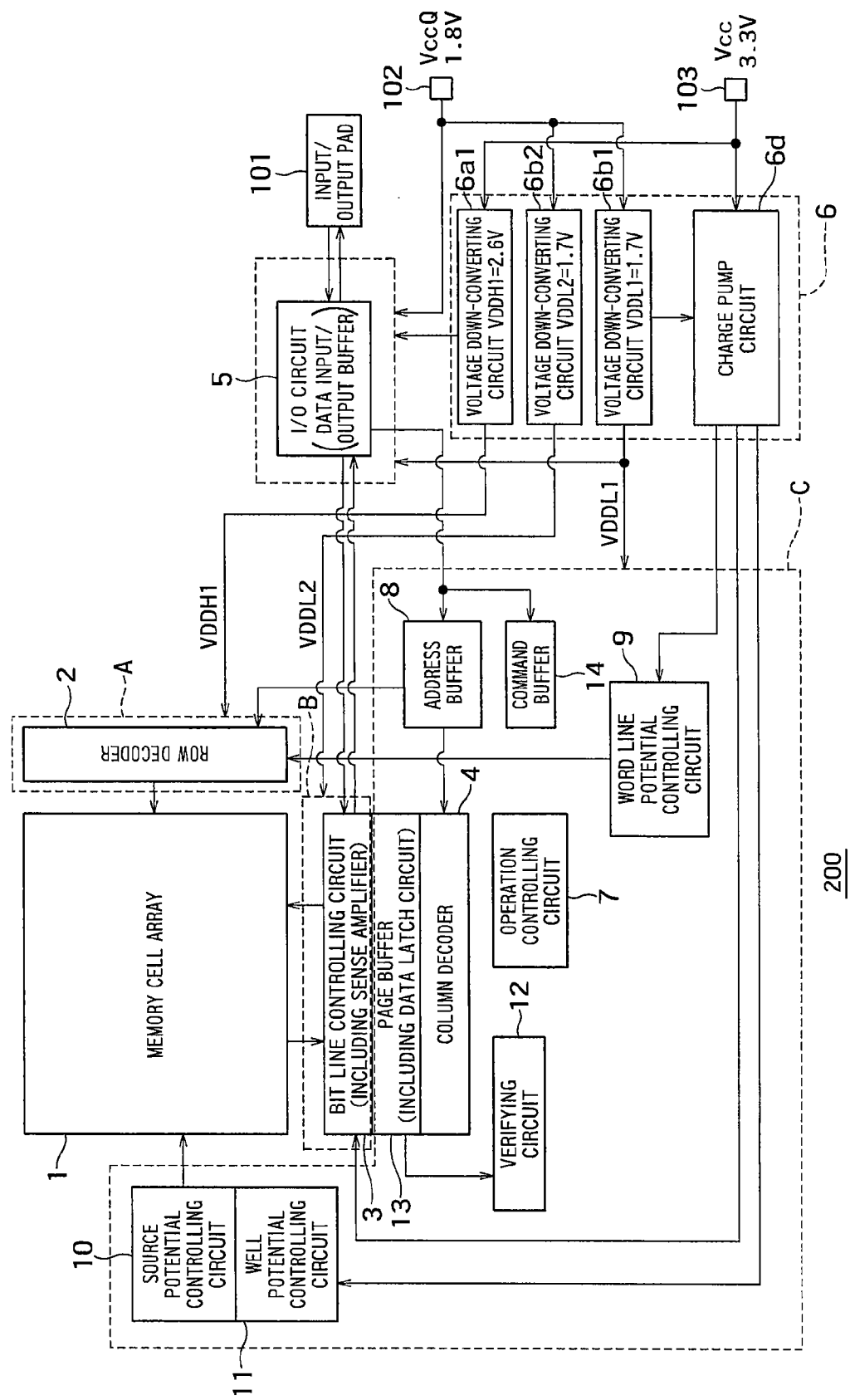
FIG. 4 is a block diagram showing a configuration of a NAND-type flash memory 200 according to the second embodiment.

FIG. 4 is a block diagram showing a configuration of a NAND-type flash memory 200 according to the second embodiment. In FIG. 4, the same reference numerals as those in FIG. 1 denote the same components as those according to the first embodiment.

As shown in FIG. 4, the NAND-type flash memory 200 differs from the NAND-type flash memory 100 according to the first embodiment in that the first voltage down-converting circuit 6a2 is replaced by a second voltage down-converting circuit 6b2.

The second voltage down-converting circuit 6b2 converts the second power supply voltage "VccQ" supplied from the second power supply voltage pad 103 down to a second down-converted voltage "VDDL2" (1.7 V, for example) lower than the first down-converted voltage "VDDH1". Instead of the first down-converted voltage "VDDH2" in the first embodiment, the second down-converted voltage "VDDL2" is supplied to the bit line controlling circuit 3.

That is, according to the second embodiment, one down-converted voltage "VDDH1" is generated from the first power supply voltage "Vcc", and two down-converted voltages "VDDL1" and "VDDL2" are generated from the second power supply voltage "VccQ".

The remainder of the configuration of the NAND-type flash memory 200 is the same as that of the NAND-type flash memory 100 according to the first embodiment.

As described above, with the NAND-type flash memory 200 according to the second embodiment, the voltage supplied to the bit line controlling circuit (sense amplifier) 3, which consumes a large amount of current, is generated from the second power supply voltage "VccQ" (1.8 V) lower than the first power supply voltage "Vcc" (3.3 V), and therefore, the power consumption and the current consumption can be more substantially reduced than in the first embodiment.

As described above, the NAND-type flash memory 200 according to the second embodiment can reduce power consumption and current consumption.

Third Embodiment

In the first and second embodiments, cases have been described where the second voltage down-converting circuit generates the second down-converted voltage only from the second power supply voltage "VccQ". In these cases, the second down-converted voltage drops when the second power supply voltage "VccQ" drops.

To solve the problem, according to a third embodiment described below, the second voltage down-converting circuit generates the second down-converted voltage from the second power supply voltage "VccQ" and the first power supply voltage "Vcc", so that the second down-converted voltage is maintained close to the desired voltage with higher reliability.

Figure 5:
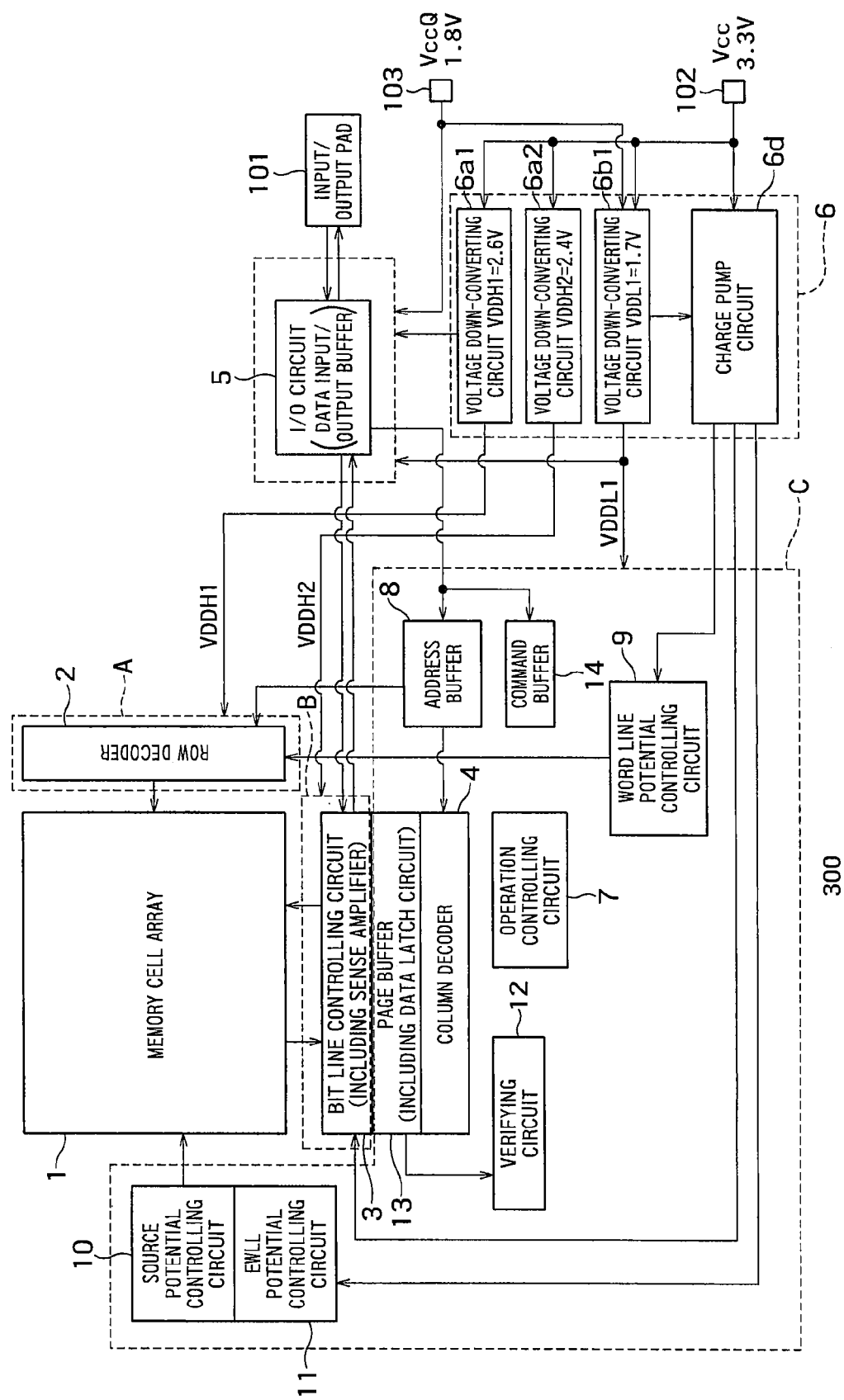
FIG. 5 is a block diagram showing a configuration of a NAND-type flash memory 300 according to the third embodiment.

FIG. 5 is a block diagram showing a configuration of a NAND-type flash memory 300 according to the third embodiment. In FIG. 5, the same reference numerals as those in FIG. 1 denote the same components as those according to the first embodiment.

As shown in FIG. 5, the first power supply voltage "Vcc" and the second power supply voltage "VccQ" are supplied to the second voltage down-converting circuit 6b1 through the first and second power supply voltage pads 102 and 103.

The second voltage down-converting circuit 6b1 is configured to generate the second down-converted voltage "VDDL1" by down-converting the first power supply voltage "Vcc" when the second power supply voltage "VccQ" drops and the second down-converted voltage "VDDL1" drops down to lower than a predetermined level.

For example, the second power supply voltage "VccQ" for the I/O circuit 5 and/or the second down-converted voltage "VDDL1" may drop in a data input/output operation (in particular, when the data output buffer is operating in a data output operation).

When the down-converted voltage "VDDL1" drops, the first power supply voltage "Vcc" is supplied to suppress the drop.

Figure 6:
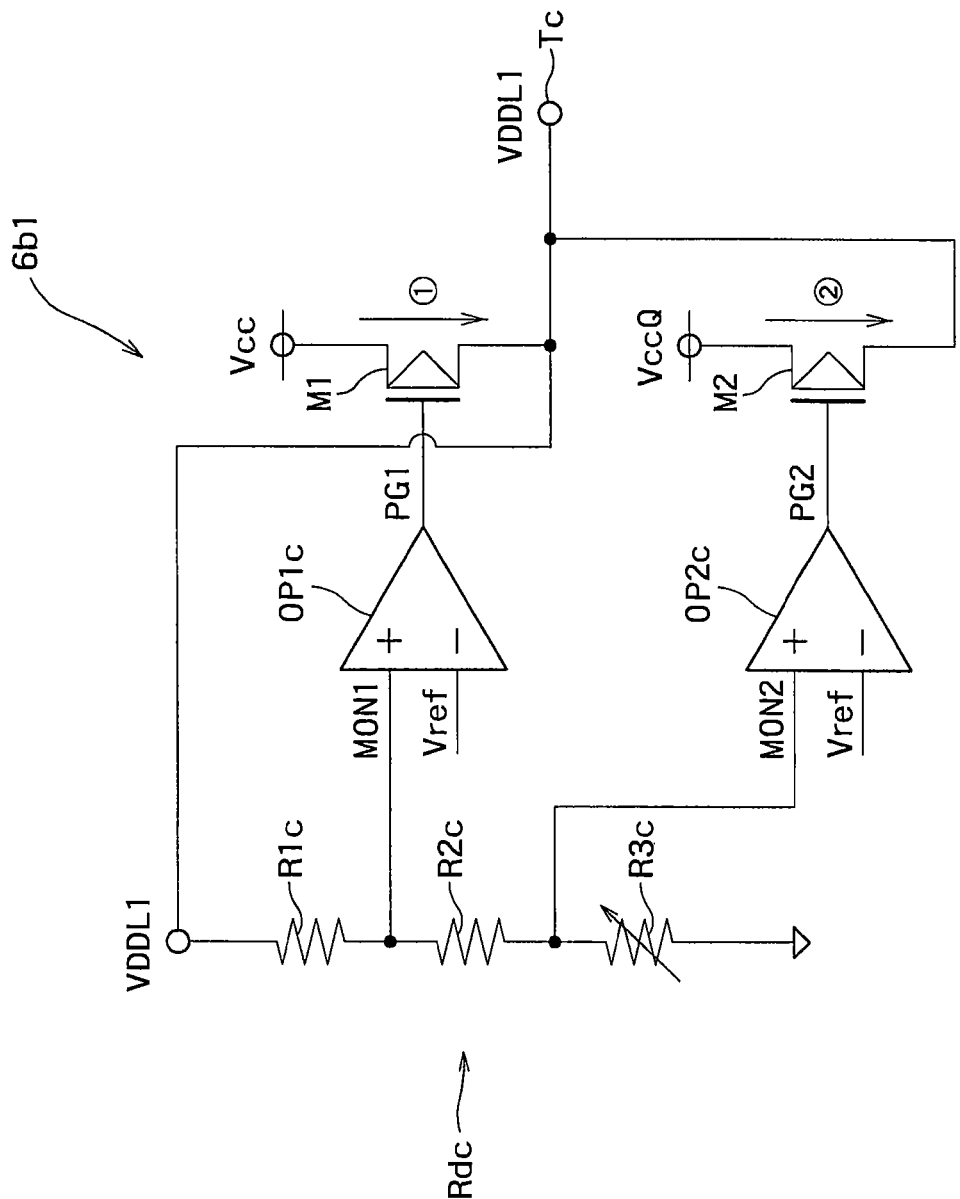
FIG. 6 is a diagram showing an example of a configuration of the voltage down-converting circuit 6$b$1 in the NAND-type flash memory 300 shown in FIG. 5.

FIG. 6 is a diagram showing an example of a configuration of the voltage down-converting circuit 6b1 in the NAND-type flash memory 300 shown in FIG. 5. Although the MOS transistors are pMOS transistors in the example shown in FIG. 6, the MOS transistors may be nMOS transistors.

As shown in FIG. 6, the second voltage down-converting circuit 6b1 has a first MOS transistor (pMOS transistor) M1, a second MOS transistor (pMOS transistor) M2, a voltage dividing circuit Rdc, and a first operational amplifier OP1c and a second operational amplifier OP2c.

The first MOS transistor M1 is connected between the first power supply voltage pad 102 through a power wire electrically connected to the first power supply voltage pad 102 and a output terminal Tc at which the second down-converted voltage "VDDL1" is output.

The second MOS transistor M2 is connected between the second power supply voltage pad 103 through a power wire electrically connected to the second power supply voltage pad 103 and the output terminal Tc.

The voltage dividing circuit Rdc divides the second down-converted voltage "VDDL1" with a first voltage dividing ratio $((R2c+R3c)/(R1c+R2c+R3c))$ determined by voltage dividing resistances $R1c$ to $R3c$ and outputs the resulting first divided voltage "MON1", and divides the second down-converted voltage "VDDL1" with a second voltage dividing ratio (R3c/(R1c+R2c+R3c)) smaller than the first voltage dividing ratio determined by the voltage dividing resistances R1c to R3c and outputs the resulting second divided voltage "MON2".

The first and second voltage dividing ratios can be adjusted by changing (trimming) the resistance of the voltage dividing resistor R3c, which is a variable resistor.

The first operational amplifier OP1c compares the first divided voltage "MON1" and a reference voltage "Vref" and outputs a first gate signal PG1 that controls the first MOS transistor M1 according to the comparison result.

If the first divided voltage "MON1" is higher than the reference voltage "Vref", the first operational amplifier OP1c outputs the first gate signal PG1 that turns off the first MOS transistor M1.

On the other hand, if the first divided voltage "MON1" is lower than the reference voltage "Vref" (that is, the second down-converted voltage "VDDL1" is lower than the predetermined level), the first operational amplifier OP1c outputs the first gate signal PG1 that turns on the first MOS transistor M1.

The second operational amplifier OP2c compares the second divided voltage "MON2" and the reference voltage "Vref" and outputs a second gate signal PG2 that controls the second MOS transistor M2 according to the comparison result.

If the second divided voltage "MON2" is higher than the reference voltage "Vref", the second operational amplifier OP2c outputs the second gate signal PG2 that turns off the second MOS transistor M2.

On the other hand, if the second divided voltage "MON2" is lower than the reference voltage "Vref", the second operational amplifier OP2c outputs the second gate signal PG2 that turns on the second MOS transistor M2.

Figure 7:
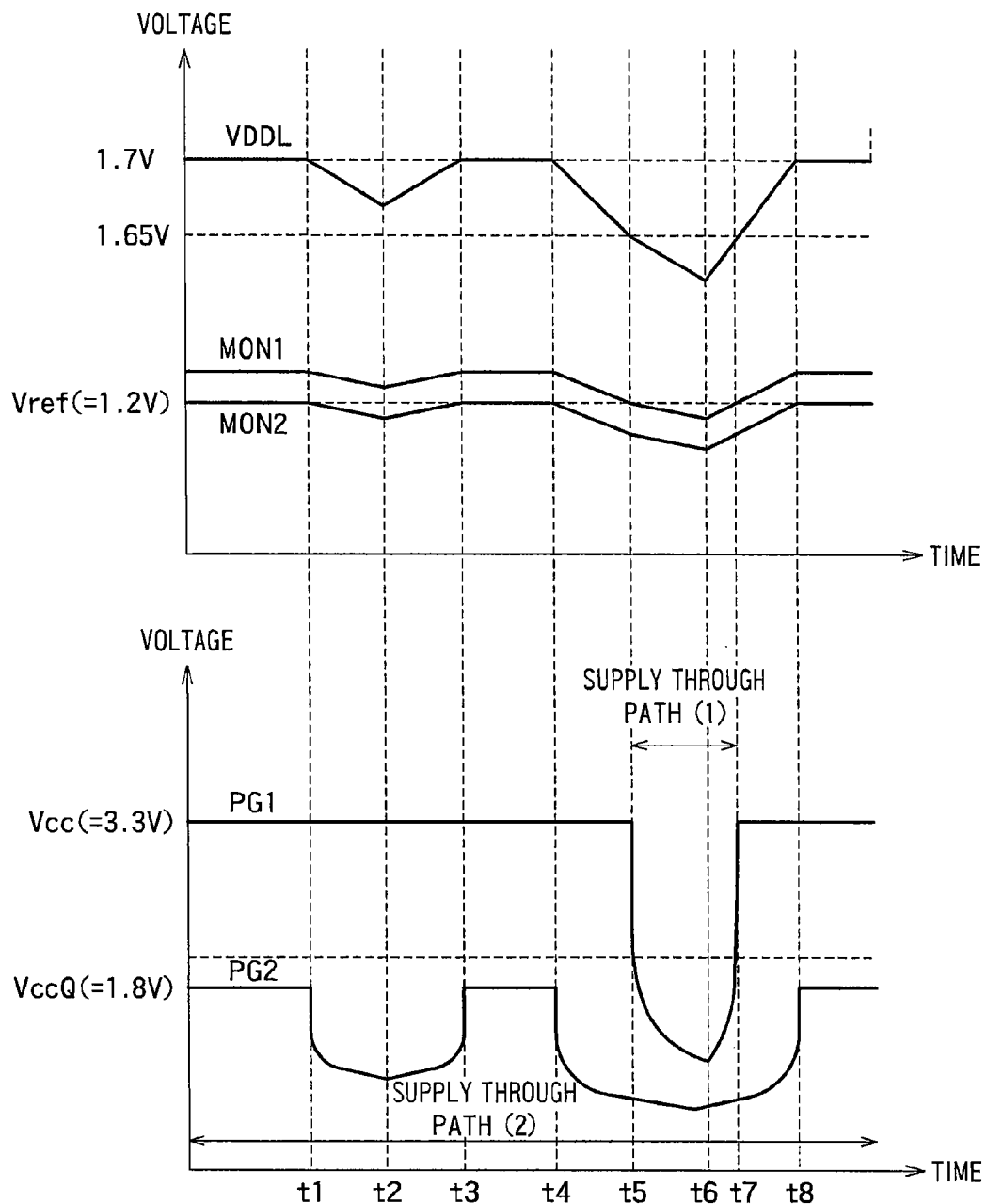
FIG. 7 is a waveform diagram showing a relationship between the down-converted voltage output from the voltage down-converting circuit 6$b$1 shown in FIG. 6 and specific operations of the voltage down-converting circuit 6$b$1.

FIG. 7 is a waveform diagram showing a relationship between the down-converted voltage output from the voltage down-converting circuit 6b1 shown in FIG. 6 and specific operations of the voltage down-converting circuit 6b1.

For example, in a period from a time t1 to a time t3, the second down-converted voltage "VDDL1" is lower than a set voltage of 1.7 V, and consequently, the second divided voltage "MON2" is lower than the reference voltage "Vref". Therefore, the second operational amplifier OP2c outputs the second gate signal PG2 that turns on the second MOS transistor M2.

However, in the period from the time t1 to the time t3, the second down-converted voltage "VDDL1" is not lower than a set voltage of 1.65 V, and the first divided voltage "MON1" is higher than the reference voltage "Vref". Therefore, the first operational amplifier OP1c outputs the first gate signal PG1 that turns off the first MOS transistor M1.

That is, in the period from the time t1 to the time t3, the second voltage down-converting circuit 6b1 generates the second down-converted voltage "VDDL1" from the second power supply voltage "VccQ" by controlling only the second MOS transistor M2 (path (2)) so that the second down-converted voltage "VDDL1" is close to the desired voltage (1.7 V).

Then, in a period from a time t5 to a time t7, the second down-converted voltage "VDDL1" is lower than the set voltage of 1.7 V, and consequently, the second divided voltage "MON2" is lower than the reference voltage "Vref". Therefore, the second operational amplifier OP2c outputs the second gate signal PG2 that turns on the second MOS transistor M2.

Furthermore, in the period from the time t5 to the time t7, the second down-converted voltage "VDDL1" is lower than the set voltage of 1.65 V, and the first divided voltage "MON1" is lower than the reference voltage "Vref". Therefore, the first operational amplifier OP1c outputs the first gate signal PG1 that turns on the first MOS transistor M1.

That is, in the period from the time t5 to the time t7, the second voltage down-converting circuit 6b1 generates the second down-converted voltage "VDDL1" from the first power supply voltage "Vcc" and the second power supply voltage "VccQ" by controlling the second MOS transistor M2 (path (2)) so that the second down-converted voltage "VDDL1" is close to the desired output voltage (1.7 V), and controlling the first MOS transistor M1 (path (1)) so that the second down-converted voltage "VDDL1" is not lower than 1.65 V.

In this way, if the second down-converted voltage "VDDL1" does not drop down to 1.65 V, the second voltage down-converting circuit 6b1 supplies the current from the second power supply voltage "VccQ" (path (2)) to control the second down-converted voltage "VDDL1". If the second down-converted voltage "VDDL1" is lower than 1.65 V, the second voltage down-converting circuit 6b1 additionally supplies the current from the first power supply voltage "Vcc" (path (1)) to suppress the second down-converted voltage "VDDL1" dropping. The path (1) provides higher overdrive (Vcc-PG1 is larger than VccQ-PG2) and therefore supplies a larger amount of current. Therefore, the second down-converted voltage "VDDL1" can suppress dropping below 1.65 V.

In FIG. 5 (in FIG. 1, FIG. 4, FIG. 8, FIG. 9, and FIG. 11 as well), single first power supply voltage pad 102 and single second power supply voltage pad 103 are shown for simple description. In an actual embodiment, plurality of the first power supply voltage pads 102 and plurality of the second power supply voltage pads 103 exist in a chip.

There exists a case where the second power supply voltage "VccQ" is not supplied to certain second power supply voltage pad 103. In that case, the second operational amplifier OP2 in the second voltage down-converting circuit connected to the second power supply voltage pad 103 to which the second power supply voltage "VccQ" is not supplied, is deactivated. That is, the second gate signal PG2 is controlled to turn off the second MOS transistor M2, and the second down-converted voltage "VDDL1" is generated by down-converting the first power supply voltage "Vcc".

For example, in a D/S test, electric power is not supplied to certain power supply voltage pads to reduce the cost of the probe card. However, as described above, even if the electric power is supplied only to the first power supply voltage pad 102, the test can be performed without any problem since the second down-converted voltage "VDDL1" can be generated by down-converting the first power supply voltage "Vcc".

The remainder of the configuration and functionality of the NAND-type flash memory 300 is the same as that of the NAND-type flash memory 100 shown in FIG. 1.

As described above, the NAND-type flash memory 300 according to the third embodiment can reduce power consumption and current consumption while suppressing the drop of the second down-converted voltage and maintaining the second down-converted voltage close to the desired voltage with higher reliability.

Fourth Embodiment

In the third embodiment, as a modification of the first embodiment, a case has been described where two down-converted voltages "VDDH1" and "VDDH2" are generated from the first power supply voltage "Vcc", and one down-converted voltage "VDDL1" is generated from the first power supply voltage "Vcc" and the second power supply voltage "VccQ".

In a fourth embodiment, as a modification of the second embodiment, a case will be described where one down-converted voltage "VDDH1" is generated from the first power supply voltage "Vcc", and two down-converted voltages "VDDL1" and "VDDL2" are generated from the first power supply voltage "Vcc" and the second power supply voltage "VccQ".

Figure 8:
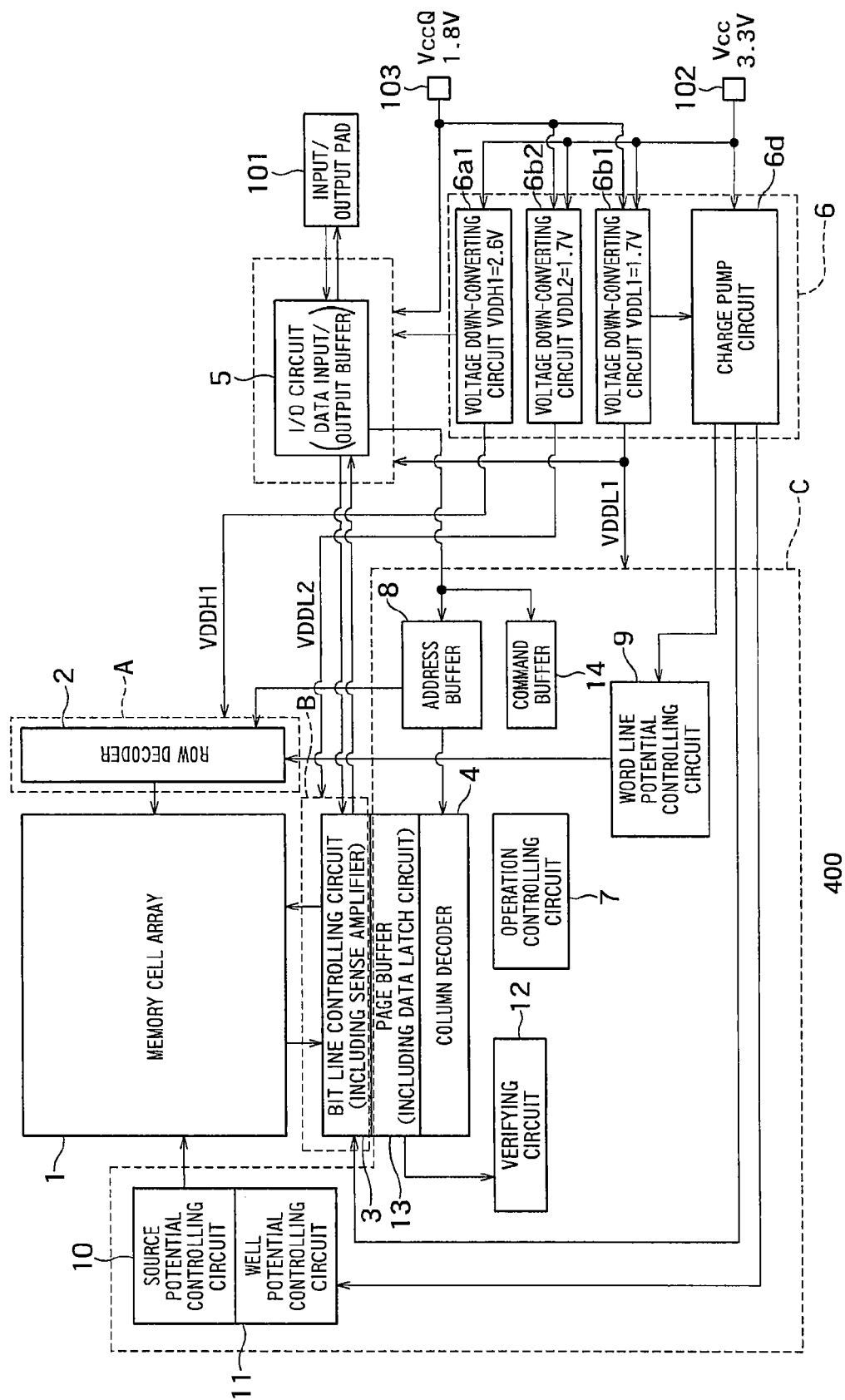
FIG. 8 is a block diagram showing a configuration of a NAND-type flash memory 400 according to the fourth embodiment.

FIG. 8 is a block diagram showing a configuration of a NAND-type flash memory 400 according to the fourth embodiment. In FIG. 8, the same reference numerals as those in FIG. 5 denote the same components as those according to the third embodiment.

As shown in FIG. 8, the first power supply voltage "Vcc" and the second power supply voltage "VccQ" are supplied to the second voltage down-converting circuits 6b1 and 6b2 through the first and second power supply voltage pads 102 and 103.

The second voltage down-converting circuits 6b1 and 6b2 are configured to generate the second down-converted voltages "VDDL1" and "VDDL2" by down-converting the first power supply voltage "Vcc" when the second power supply voltage "VccQ" drops, and therefore the second down-converted voltages "VDDL1" and "VDDL2" drop down to lower than a predetermined level.

The configuration of the second voltage down-converting circuits 6b1 and 6b2 is the same as the configuration shown in FIG. 6 described above, and the relationship between the down-converted voltage output from the second voltage down-converting circuits 6b1 and 6b2 and specific operations of the voltage down-converting circuits 6b1 and 6b2 is also the same as the relationship shown in FIG. 7.

As in the third embodiment, for example, the second power supply voltage "VccQ" for the I/O circuit 5 and/or the second down-converted voltage "VDDL1" or "VDDL2" may drop in the data input/output operation (in particular, when the data output buffer is operating in a data output operation).

When either of the second down-converted voltages "VDDL1" and "VDDL2" drops, the first power supply voltage "Vcc" is supplied to suppress the drop of the second down-converted voltages "VDDL1" and "VDDL2".

The remainder of the configuration and functionality of the NAND-type flash memory 400 is the same as that of the NAND-type flash memory 100 shown in FIG. 1.

As described above, the NAND-type flash memory 400 according to the fourth embodiment can reduce power consumption and current consumption while suppressing the drop of the second down-converted voltages and maintaining the second down-converted voltages close to the desired voltages with higher reliability.

Fifth Embodiment

In the third and fourth embodiments, cases have been described where the second voltage down-converting circuit generates the second down-converted voltage from the second power supply voltage "VccQ" and the first power supply voltage "Vcc".

In a fifth embodiment, as a modification of the third embodiment, a configuration that controls activation of the second voltage down-converting circuit according to the second power supply voltage "VccQ" will be described.

Figure 9:
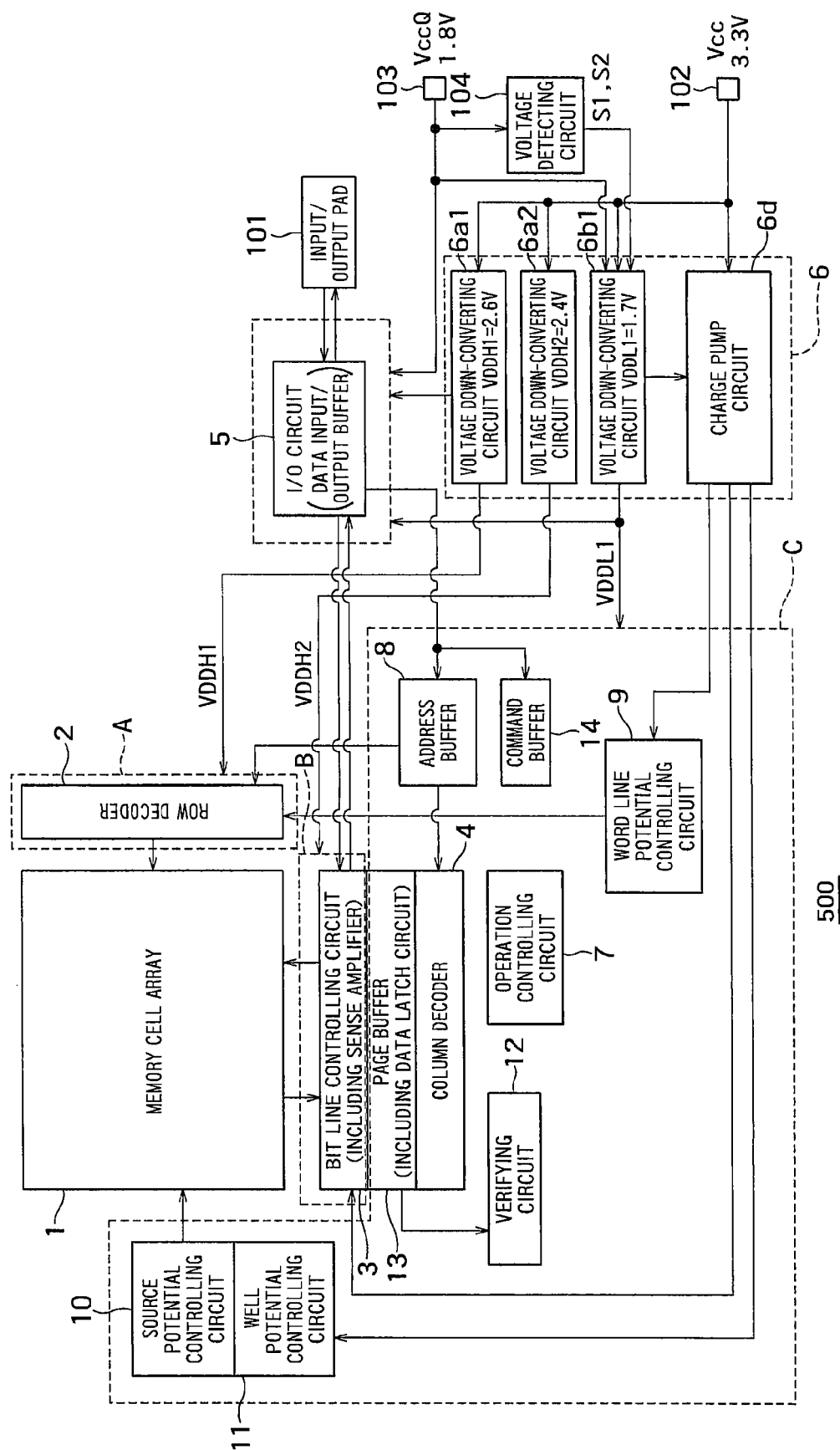
FIG. 9 is a block diagram showing a configuration of a NAND-type flash memory 500 according to the fifth embodiment.

FIG. 9 is a block diagram showing a configuration of a NAND-type flash memory 500 according to the fifth embodiment. In FIG. 9, the same reference numerals as those in FIG. 5 denote the same components as those according to the third embodiment.

As shown in FIG. 9, the NAND-type flash memory 500 differs from the NAND-type flash memory according to the third embodiment in that the NAND-type flash memory 500 further includes a voltage detecting circuit 104 that detects the voltage of the second power supply voltage pad 103.

If the voltage of the second power supply voltage pad 103 is equal to or higher than a predetermined reference detection level, the voltage detecting circuit 104 outputs a second control signal S2 to the second voltage down-converting circuit 6b1 to generate the second down-converted voltage "VDDL1" by down-converting the second power supply voltage "VccQ".

Furthermore, if the voltage of the second power supply voltage pad 103 is lower than the reference detection level, the voltage detecting circuit 104 outputs a first control signal S1 to the second voltage down-converting circuit 6b1 to generate the second down-converted voltage "VDDL1" by down-converting at least the first power supply voltage "Vcc". In this case, the voltage detecting circuit 104 may additionally output the second control signal S2 to the second voltage down-converting circuit 6b1 to generate the second down-converted voltage "VDDL1" by lowering the second power supply voltage "VccQ".

Figure 10:
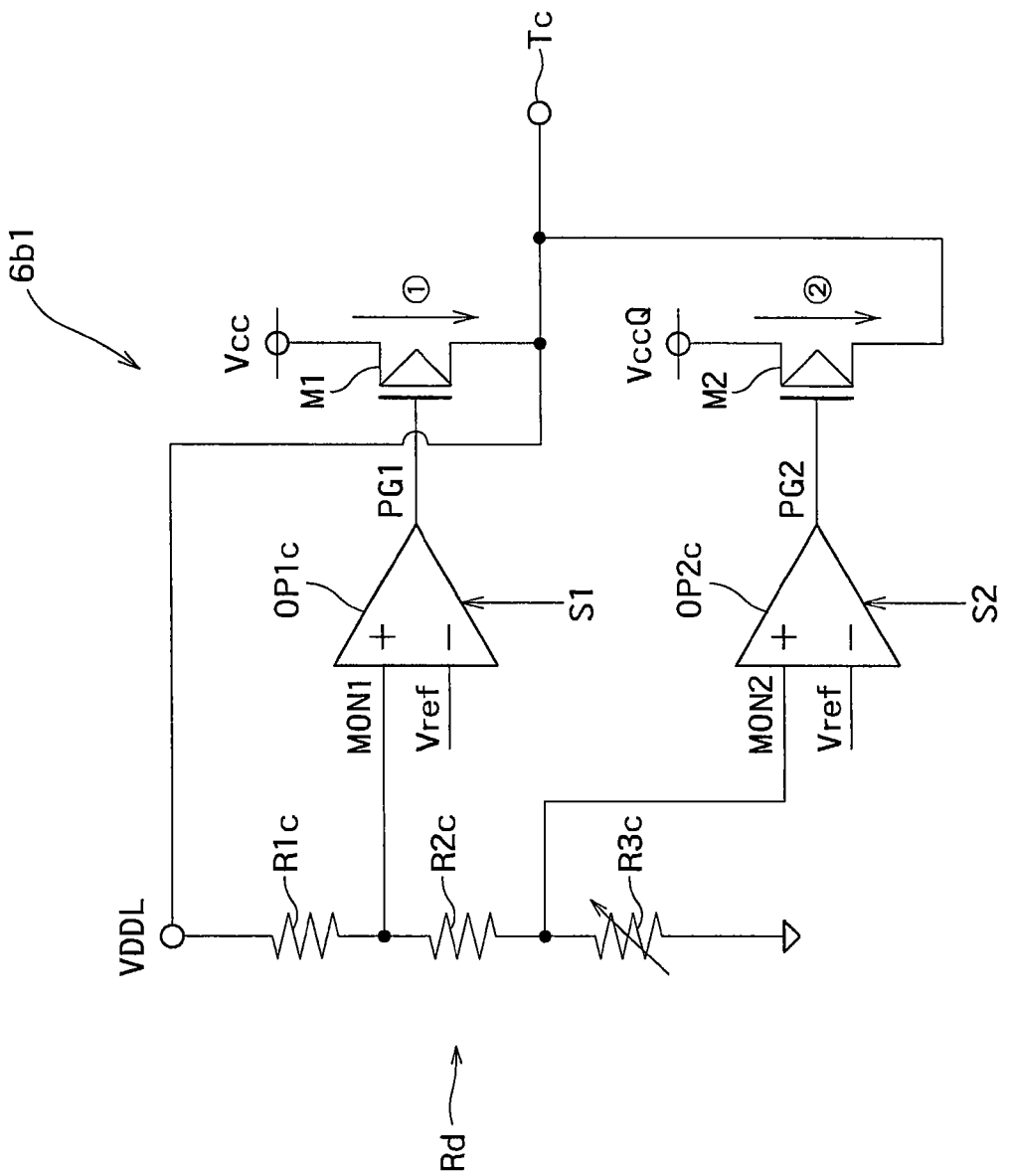
FIG. 10 is a diagram showing an example of the configuration of the voltage down-converting circuit 6$b$1 in the NAND-type flash memory 500 shown in FIG. 9.

FIG. 10 shows an example of the configuration of the voltage down-converting circuit 6b1 in the NAND-type flash memory 500 shown in FIG. 9. In FIG. 10, the same reference numerals as those in FIG. 6 denote the same components as those in the third embodiment.

As shown in FIG. 10, the second voltage down-converting circuit 6b1 differs from the second voltage down-converting circuit according to the third embodiment in that the first control signal S1 is input to the first operational amplifier OP1c, and the second control signal S2 is input to the second operational amplifier OP2c.

In response to the first control signal 51, the second voltage down-converting circuit 6b1 activates the first operational amplifier OP1c to control turning on and off of the first output transistor M1. In response to the second control signal S2, the second voltage down-converting circuit 6b1 activates the second operational amplifier OP2c to control turning on and off of the second output transistor M2.

Except that the second voltage down-converting circuit 6b1 controls activation of the operational amplifiers, specific operations of the second voltage down-converting circuit 6b1 are the same as those according to the third embodiment described above with reference to FIG. 7.

The remainder of the configuration and functionality of the NAND-type flash memory 500 is the same as that of the NAND-type flash memory 300 according to the third embodiment.

As described above, the NAND-type flash memory 500 according to the fifth embodiment can reduce power consumption and current consumption while suppressing the drop of the second down-converted voltages and maintaining the second down-converted voltages close to the desired voltages with higher reliability, as in the third embodiment.

Sixth Embodiment

In the fifth embodiment, as a modification of the third embodiment, a configuration that controls activation of the second voltage down-converting circuit according to the second power supply voltage "VccQ" has been described.

In a sixth embodiment, as a modification of the fourth embodiment, a configuration that controls activation of the second voltage down-converting circuit according to the second power supply voltage "VccQ" will be described.

Figure 11:
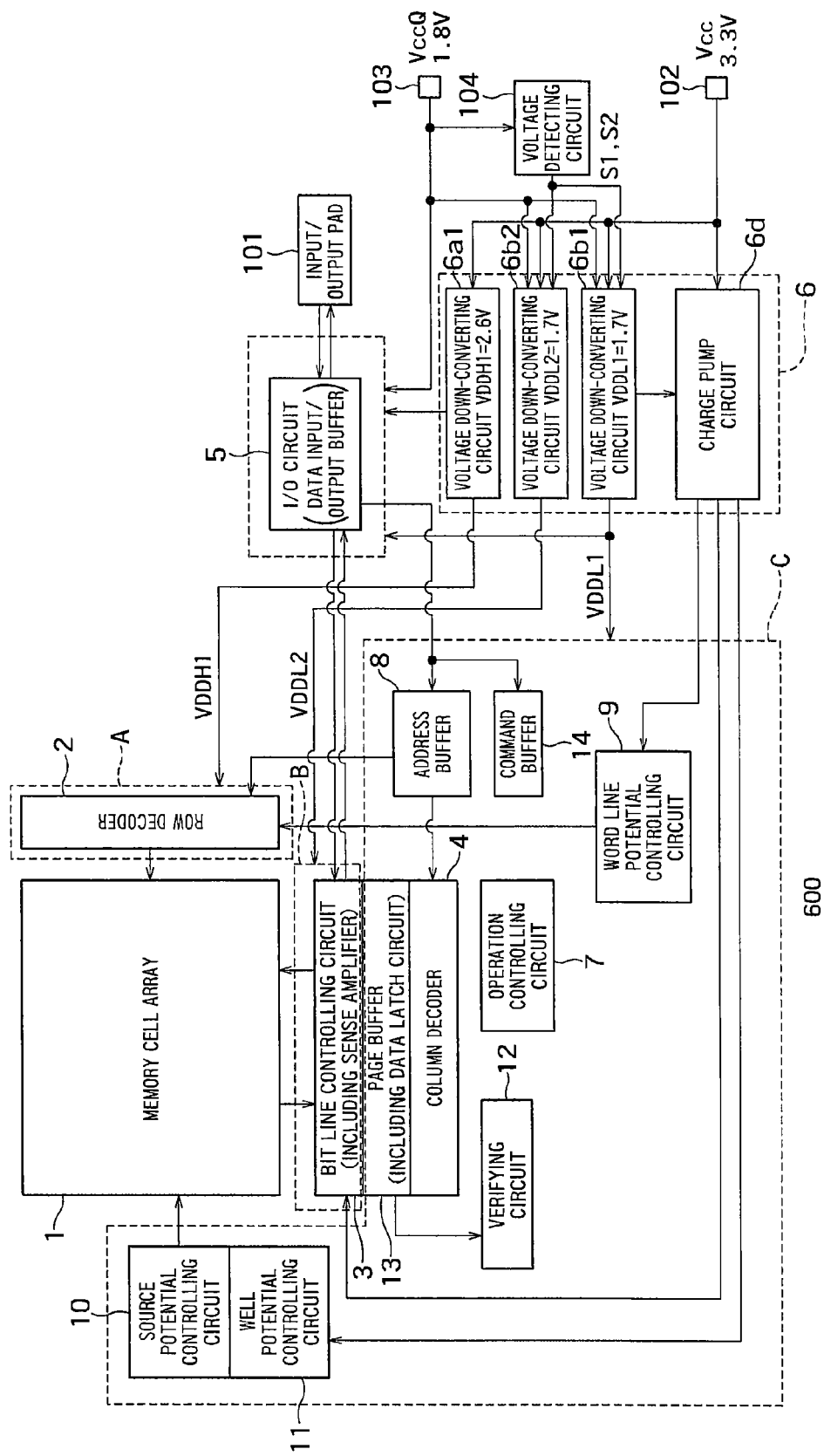
FIG. 11 is a block diagram showing a configuration of a NAND-type flash memory 600 according to the sixth embodiment.

FIG. 11 is a block diagram showing a configuration of a NAND-type flash memory 600 according to the sixth embodiment. In FIG. 11, the same reference numerals as those in FIG. 8 denote the same components as those according to the fourth embodiment.

As shown in FIG. 11, the NAND-type flash memory 600 differs from the NAND-type flash memory according to the fourth embodiment in that the NAND-type flash memory 600 further includes a voltage detecting circuit 104 that detects the voltage of the second power supply voltage pad 103.

As in the fifth embodiment, if the voltage of the second power supply voltage pad 103 is equal to or higher than a predetermined reference detection level, the voltage detecting circuit 104 outputs a second control signal S2 to the second voltage down-converting circuits 6b1 and 6b2 to generate the second down-converted voltages "VDDL1" and "VDDL2" by down-converting the second power supply voltage "VccQ".

Furthermore, if the voltage of the second power supply voltage pad 103 is lower than the reference detection value, the voltage detecting circuit 104 outputs a first control signal S1 to the second voltage down-converting circuits 6b1 and 6b2 to generate the second down-converted voltages "VDDL1" and "VDDL2" by down-converting at least the first power supply voltage "Vcc". In this case, the voltage detecting circuit 104 may additionally output the second control signal S2 to the second voltage down-converting circuits 6b1 and 6b2 to generate and output the second down-converted voltages "VDDL1" and "VDDL2" by down-converting the second power supply voltage "VccQ".

The configuration of the second voltage down-converting circuits 6b1 and 6b2 is the same as the configuration shown in FIG. 10 described above.

The remainder of the configuration and functionality of the NAND-type flash memory 600 is the same as that of the NAND-type flash memory 400 according to the fourth embodiment.

As described above, the NAND-type flash memory 600 according to the sixth embodiment can reduce power consumption and current consumption while suppressing the drop of the second down-converted voltages and maintaining the second down-converted voltages close to the desired voltages with higher reliability, as in the fourth embodiment.

Seventh Embodiment

In a seventh embodiment, a specific example of the layout of the first and second power supply pads and the like will be described. Although an example in which the layout is applied to the configuration of the NAND-type flash memory 100 according to the first embodiment will be described, the layout can be equally applied to the NAND-type flash memories according to the other embodiments.

Figure 12:
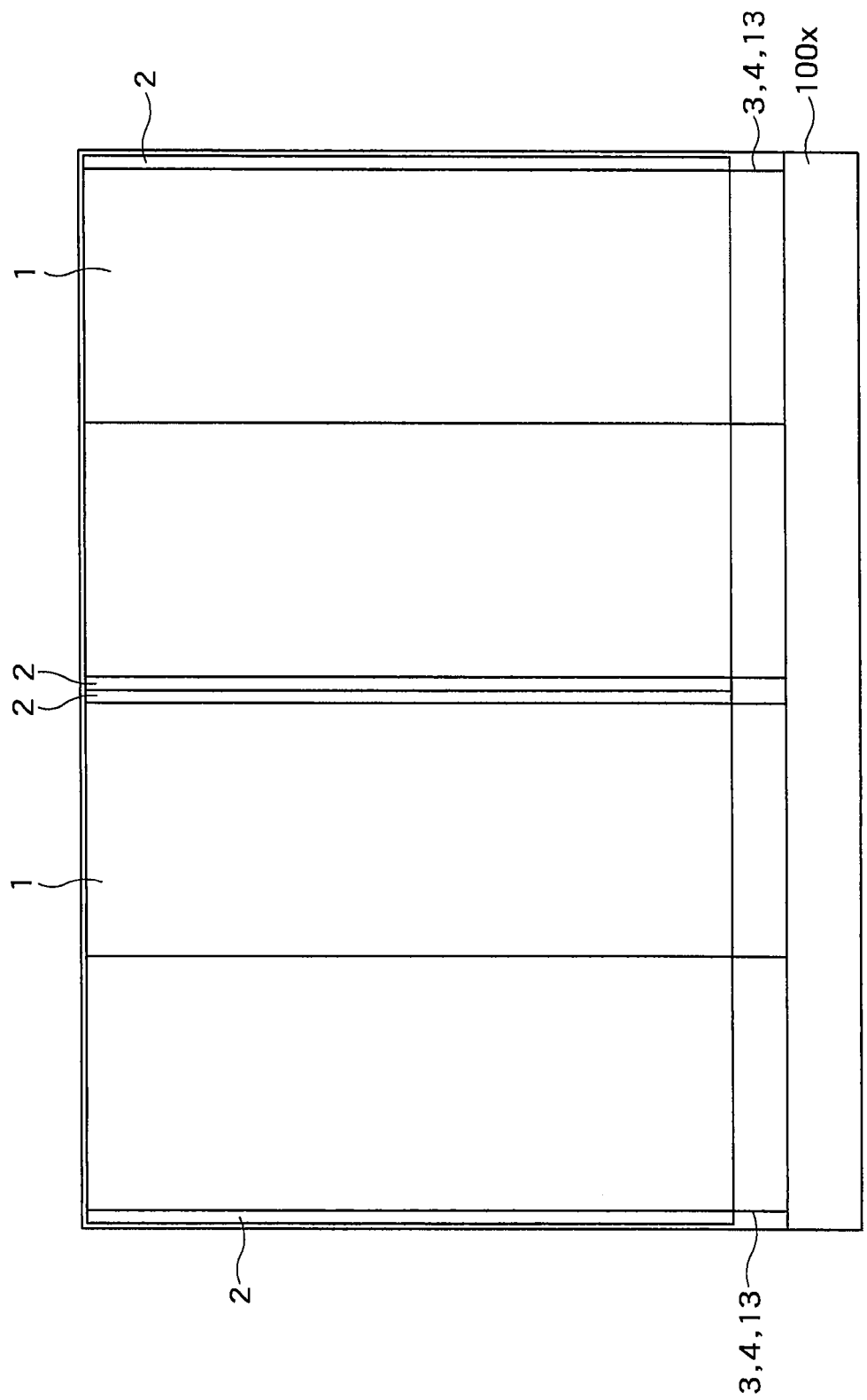
FIG. 12 is a diagram showing an example of the layout of components of the NAND-type flash memory 100 shown in FIG. 1.

FIG. 12 is a diagram showing an example of the layout of components of the NAND-type flash memory 100 shown in FIG. 1. In FIG. 12, the same reference numerals as those in FIG. 1 denote the same components as those according to the first embodiment.

In a peripheral circuit region 100x shown in FIG. 12, the I/O circuit (data input/output buffer) 5, the inner voltage generating circuit 6, the operation controlling circuit 7, the address buffer 8, the word line potential controlling circuit 9, the well potential controlling circuit 11, the source potential controlling circuit 10, the verifying circuit 12, the command buffer 14, the input/output pad 101, the first power supply voltage pad 102, the second power supply voltage pad 103, and a ground voltage pad described later are disposed.

Figure 13:
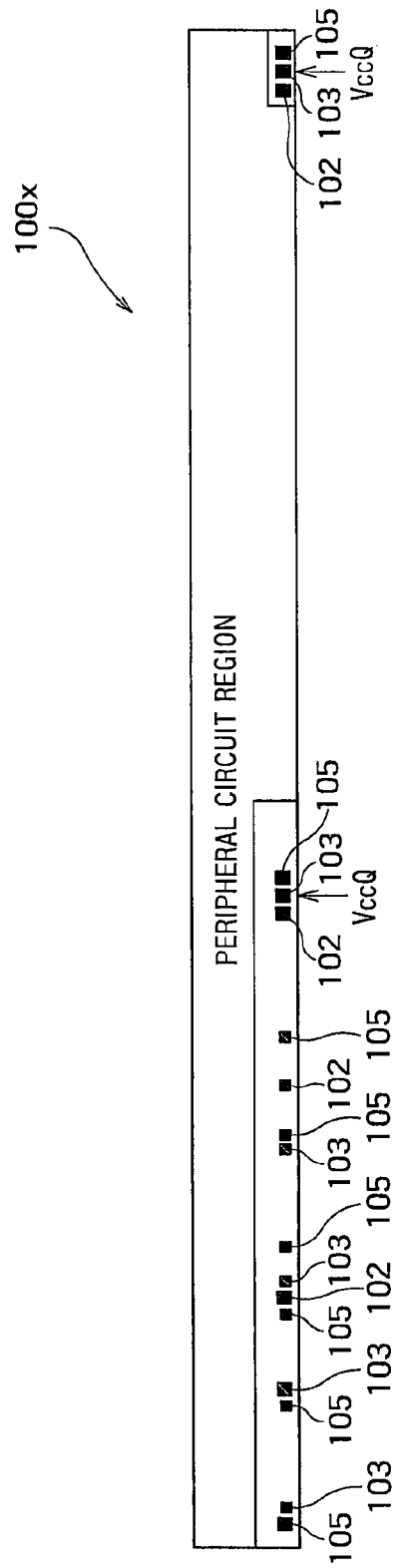
FIG. 13 is a diagram showing an example of the layout focused on the peripheral circuit region 100$x$ shown in FIG. 12.

FIG. 13 is a diagram showing an example of the layout focused on the peripheral circuit region 100x shown in FIG. 12. Illustration of the ground voltage pad 105 shown in FIG. 13 is omitted in FIG. 1.

As shown in FIG. 13, in the peripheral circuit region 100x, the first power supply voltage pads 102, the second power supply voltage pads 103 and the ground voltage pads 105 are arranged. To supply the first down-converted voltage and the second down-converted voltage enough to all the circuit in the peripheral circuit region 100x, it's preferable disposing the first power supply voltage pad 102 and the second power supply voltage pad 103 at least in the left-end part, in the center part, and in the right-end part. Most of voltage down-converting circuits are disposed near power supply voltage pads.

In particular, in the left part, central part and right-end part of the peripheral circuit region 100x, the first power supply voltage pads 102 and the second power supply voltage pads 103 are arranged adjacent to each other. This helps reducing the resistance of the power supply line for supplying the first power supply voltage "Vcc" and the second power supply voltage "VccQ" to the second voltage down-converting circuit 6b1 or reducing the area for the power supply line to the second voltage down-converting circuit 6b1, in the case where the second voltage down-converting circuit 6b1 is supplied with both of the first power supply voltage and the second power supply voltage as described in the third, fourth, fifth, and sixth embodiments.

As described above, according to the seventh embodiment, the power consumption and the current consumption can be reduced while reducing the resistance of the wiring.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory, comprising:
a memory cell array including a plurality of memory cells;
an input/output pad;
an I/O circuit that outputs data read from the memory cells to the outside through the input/output pad and to which writing data and a command are input from the outside through the input/output pad;
a first power supply voltage pad to which a first power supply voltage required for a writing, reading or erasing operation of the memory cells is applied;
a second power supply voltage pad to which a second power supply voltage that is lower than the first power supply voltage and to be supplied to the I/O circuit is applied;
a first voltage down-converting circuit that converts the first power supply voltage down to a first down-converted voltage that is higher than the second power supply voltage;

a second voltage down-converting circuit that converts the second power supply voltage down to a second down-converted voltage that is lower than the first down-converted voltage;
a first circuit group that requires a voltage equal to or lower than the first power supply voltage and equal to or higher than the second power supply voltage and to which the first down-converted voltage is supplied; and
a second circuit group to which the second down-converted voltage is supplied.

2. The nonvolatile semiconductor memory according to claim 1, wherein the second voltage down-converting circuit generates the second down-converted voltage by down-converting the first power supply voltage in a case where the second down-converted voltage drops down to lower than a predetermined level.

3. The nonvolatile semiconductor memory according to claim 2, wherein the second voltage down-converting circuit has:
a first MOS transistor connected between the first power supply voltage pad and a output terminal at which the second down-converted voltage is output;
a second MOS transistor connected between the second power supply voltage pad and the output terminal;
a voltage dividing circuit that outputs a first divided voltage generated by dividing the second down-converted voltage with a first voltage dividing ratio, and outputs a second divided voltage generated by dividing the second down-converted voltage with a second voltage dividing ratio smaller than the first voltage dividing ratio;
a first operational amplifier that compares the first divided voltage with a reference voltage and outputs a first gate signal that controls the first MOS transistor according to the comparison result; and
a second operational amplifier that compares the second divided voltage with the reference voltage and outputs a second gate signal that controls the second MOS transistor according to the comparison result,
the first operational amplifier outputs the first gate signal to turn off the first MOS transistor in a case where the first divided voltage is higher than the reference voltage and outputs the first gate signal to turn on the first MOS transistor in a case where the first divided voltage is lower than the reference voltage, and
the second operational amplifier outputs the second gate signal to turn off the second MOS transistor in a case where the second divided voltage is higher than the reference voltage and outputs the second gate signal to turn on the second MOS transistor in a case where the second divided voltage is lower than the reference voltage.

4. The nonvolatile semiconductor memory according to claim 3, further comprising:
a voltage detecting circuit that detects whether a voltage of the second power supply voltage pad is higher or lower than a reference detection level,
wherein the second voltage down-converting circuit generates the second down-converted voltage by down-converting the second power supply voltage in a case where the voltage of the second power supply voltage pad is higher than the reference detection level, and
the second voltage down-converting circuit generates the second down-converted voltage by down-converting the first power supply voltage in a case where the voltage of the second power supply voltage pad is lower than the reference detection level.

5. The nonvolatile semiconductor memory according to claim 2, further comprising:
a voltage detecting circuit that detects whether a voltage of the second power supply voltage pad is higher or lower than a reference detection level,
wherein the second voltage down-converting circuit generates the second down-converted voltage by down-converting the second power supply voltage in a case where the voltage of the second power supply voltage pad is higher than the reference detection level, and
the second voltage down-converting circuit generates the second down-converted voltage by down-converting the first power supply voltage in a case where the voltage of the second power supply voltage pad is lower than the reference detection level.

6. The nonvolatile semiconductor memory according to claim 1, wherein the second voltage down-converting circuit has:
an MOS transistor connected between the second power supply voltage pad and a output terminal at which the second down-converted voltage is output;
a voltage dividing circuit that outputs a divided voltage generated by dividing the second down-converted voltage; and
an operational amplifier that compares the divided voltage with a reference voltage and outputs a gate signal that controls the MOS transistor according to the comparison result;
the operational amplifier outputs the gate signal to turn off the MOS transistor in a case where the divided voltage is higher than the reference voltage and outputs the gate signal to turn on the MOS transistor in a case where the divided voltage is lower than the reference voltage.

7. The nonvolatile semiconductor memory according to claim 1, wherein the first power supply voltage pad and the second power supply voltage pad are disposed adjacent to each other in a peripheral circuit region.

8. The nonvolatile semiconductor memory according to claim 2, wherein the first power supply voltage pad and the second power supply voltage pad are disposed adjacent to each other in a peripheral circuit region.

9. The nonvolatile semiconductor memory according to claim 1, wherein the nonvolatile semiconductor memory is a NAND-type flash memory.

10. The nonvolatile semiconductor memory according to claim 9, wherein the first circuit group includes any of a row decoder that selects a word line from among word lines in the memory cell array and drives the selected word line and a bit line controlling circuit that controls a potential of a bit line and senses a voltage of the bit line.

11. A nonvolatile semiconductor memory, comprising:
a memory cell array including a plurality of memory cells;
a first power supply voltage pad to which a first power supply voltage required for a writing, reading or erasing operation of the memory cells is applied;
a second power supply voltage pad to which a second power supply voltage that is lower than the first power supply voltage;
a first voltage down-converting circuit that converts the first power supply voltage down to a first down-converted voltage that is higher than the second power supply voltage;
a second voltage down-converting circuit that converts the second power supply voltage down to a second down-converted voltage that is lower than the first down-converted voltage;

a first circuit group that requires a voltage equal to or lower than the first power supply voltage and equal to or higher than the second power supply voltage and to which the first down-converted voltage is supplied; and a second circuit group to which the second down-converted voltage is supplied.

12. The nonvolatile semiconductor memory according to claim 11, wherein the second voltage down-converting circuit generates the second down-converted voltage by down-converting the first power supply voltage in a case where the second down-converted voltage drops down to lower than a predetermined level.

13. The nonvolatile semiconductor memory according to claim 12, wherein the second voltage down-converting circuit has:

a first MOS transistor connected between the first power supply voltage pad and a output terminal at which the second down-converted voltage is output;

a second MOS transistor connected between the second power supply voltage pad and the output terminal;

a voltage dividing circuit that outputs a first divided voltage generated by dividing the second down-converted voltage with a first voltage dividing ratio, and outputs a second divided voltage generated by dividing the second down-converted voltage with a second voltage dividing ratio smaller than the first voltage dividing ratio;

a first operational amplifier that compares the first divided voltage with a reference voltage and outputs a first gate signal that controls the first MOS transistor according to the comparison result; and a second operational amplifier that compares the second divided voltage with the reference voltage and outputs a second gate signal that controls the second MOS transistor according to the comparison result, the first operational amplifier outputs the first gate signal to turn off the first MOS transistor in a case where the first divided voltage is higher than the reference voltage and outputs the first gate signal to turn on the first MOS transistor in a case where the first divided voltage is lower than the reference voltage, and the second operational amplifier outputs the second gate signal to turn off the second MOS transistor in a case where the second divided voltage is higher than the reference voltage and outputs the second gate signal to turn on the second MOS transistor in a case where the second divided voltage is lower than the reference voltage.

14. The nonvolatile semiconductor memory according to claim 13, further comprising:

a voltage detecting circuit that detects whether a voltage of the second power supply voltage pad is higher or lower than a reference detection level, wherein the second voltage down-converting circuit generates the second down-converted voltage by down-converting the second power supply voltage in a case where the voltage of the second power supply voltage pad is higher than the reference detection level, and the second voltage down-converting circuit generates the second down-converted voltage by down-converting the first power supply voltage in a case where the voltage of the second power supply voltage pad is lower than the reference detection level.

15. The nonvolatile semiconductor memory according to claim 12, further comprising:

a voltage detecting circuit that detects whether a voltage of the second power supply voltage pad is higher or lower than a reference detection level, wherein the second voltage down-converting circuit generates the second down-converted voltage by down-converting the second power supply voltage in a case where the voltage of the second power supply voltage pad is higher than the reference detection level, and the second voltage down-converting circuit generates the second down-converted voltage by down-converting the first power supply voltage in a case where the voltage of the second power supply voltage pad is lower than the reference detection level.

16. The nonvolatile semiconductor memory according to claim 11, wherein the second voltage down-converting circuit has:

an MOS transistor connected between the second power supply voltage pad and a output terminal at which the second down-converted voltage is output;

a voltage dividing circuit that outputs a divided voltage generated by dividing the second down-converted voltage; and an operational amplifier that compares the divided voltage with a reference voltage and outputs a gate signal that controls the MOS transistor according to the comparison result;

the operational amplifier outputs the gate signal to turn off the MOS transistor in a case where the divided voltage is higher than the reference voltage and outputs the gate signal to turn on the MOS transistor in a case where the divided voltage is lower than the reference voltage.

17. The nonvolatile semiconductor memory according to claim 11, wherein the first power supply voltage pad and the second power supply voltage pad are disposed adjacent to each other in a peripheral circuit region.

18. The nonvolatile semiconductor memory according to claim 12, wherein the first power supply voltage pad and the second power supply voltage pad are disposed adjacent to each other in a peripheral circuit region.

19. The nonvolatile semiconductor memory according to claim 11, wherein the nonvolatile semiconductor memory is a NAND-type flash memory.

20. The nonvolatile semiconductor memory according to claim 19, wherein the first circuit group includes any of a row decoder that selects a word line from among word lines in the memory cell array and drives the selected word line and a bit line controlling circuit that controls a potential of a bit line and senses a voltage of the bit line.

* * * * *